United States Patent
Kuwahara

(10) Patent No.: US 9,984,178 B2
(45) Date of Patent: May 29, 2018

(54) ROBOT SIMULATOR, ROBOT TEACHING APPARATUS AND ROBOT TEACHING METHOD

(71) Applicant: KABUSHIKI KAISHA YASKAWA DENKI, Kitakyushu-shi (JP)

(72) Inventor: Koichi Kuwahara, Fukuoka (JP)

(73) Assignee: KABUSHIKI KAISHA YASKAWA DENKI, Kitakyushu-Shi (JP)

( * ) Notice: Subject to any disclaimer, the term of this patent is extended or adjusted under 35 U.S.C. 154(b) by 761 days.

(21) Appl. No.: 14/183,404

(22) Filed: Feb. 18, 2014

(65) Prior Publication Data

US 2014/0236565 A1    Aug. 21, 2014

(30) Foreign Application Priority Data

Feb. 21, 2013  (JP) ................... 2013-032170

(51) Int. Cl.
  *G06F 9/45*   (2006.01)
  *G06F 17/50*  (2006.01)
  *B25J 9/16*   (2006.01)
(52) U.S. Cl.
  CPC ........ *G06F 17/5009* (2013.01); *B25J 9/1671* (2013.01); *G05B 2219/40091* (2013.01);
  (Continued)
(58) Field of Classification Search
  None
  See application file for complete search history.

(56) References Cited

U.S. PATENT DOCUMENTS

| 2004/0189631 A1* | 9/2004 | Kazi ...................... B25J 9/1671 345/418 |
| 2005/0080515 A1* | 4/2005 | Watanabe .............. B25J 9/1671 700/264 |

(Continued)

FOREIGN PATENT DOCUMENTS

| JP | 3901772 B2 | 6/1998 |
| JP | 2012-066322 | 4/2012 |

(Continued)

OTHER PUBLICATIONS

Fang, H.C., et al., "Robot Programming using Augmented Reality", 2009, International Conference on CyberWorlds, IEEE.*

(Continued)

*Primary Examiner* — Cedric Johnson
(74) *Attorney, Agent, or Firm* — Mori & Ward, LLP

(57) ABSTRACT

A robot simulator includes a generating unit, a display unit, a display control unit, and a simulation instructing unit. The generating unit generates a virtual image that includes a virtual robot obtained by imaging an actual robot having at least one axis and an operation handle capable of operating three-dimensional coordinate axes having a predetermined control point of the virtual robot as the origin. The display control unit displays on the display unit the generated virtual image. The simulation instructing unit, when an operator's operation for the operation handle is received, acquires at least one of a displacement amount of the control point and a rotation amount of the three-dimensional coordinate axes attributable to the operator's operation, and instructs the generating unit to regenerate the virtual image in which a posture of the virtual robot is changed in accordance with the displacement amount or the rotation amount thus acquired.

20 Claims, 21 Drawing Sheets

(52) U.S. Cl.
CPC ............... *G05B 2219/40311* (2013.01); *G05B 2219/40324* (2013.01)

(56) References Cited

U.S. PATENT DOCUMENTS

| | | | |
|---|---|---|---|
| 2012/0136481 A1* | 5/2012 | Maisonnier | B25J 9/1661 700/257 |
| 2012/0150352 A1 | 6/2012 | Park | |
| 2012/0229450 A1 | 9/2012 | Kim et al. | |
| 2012/0239192 A1* | 9/2012 | Yamato | B25J 9/1682 700/250 |
| 2013/0345872 A1* | 12/2013 | Brooks | B25J 9/0087 700/259 |

FOREIGN PATENT DOCUMENTS

| | | |
|---|---|---|
| JP | 2012-192468 | 10/2012 |
| KR | 10-2004-0050190 | 6/2004 |
| KR | 10-0968944 B1 | 7/2010 |
| KR | 10-2012-0103076 | 9/2012 |
| KR | 10-1193211 B1 | 10/2012 |

OTHER PUBLICATIONS

Hashimoto, Sunao et al., "TouchMe: An Augmented Reality Based Remote Robot Manipulation", Nov. 28-30, 2011, The 21st International Conference on Artificial Reality and Telexistence, The Virtual Reality Society of Japan. (Year: 2011).*

Chen, ChuXin et al., "Simulation and Animation of Sensor-Driven Robots", Oct. 1994, IEEE Transactions on Robotics and Automation, vol. 10, No. 5, IEEE. (Year: 1994).*

Korean Office Action for corresponding KR Application No. 10-2014-0019594, dated Mar. 15, 2016.

Korean Office Action for corresponding KR Application No. 10-2014-0019594, dated Aug. 26, 2015.

Japanese Office Action for corresponding JP Application No. 2013-032170, dated Sep. 16, 2014.

* cited by examiner

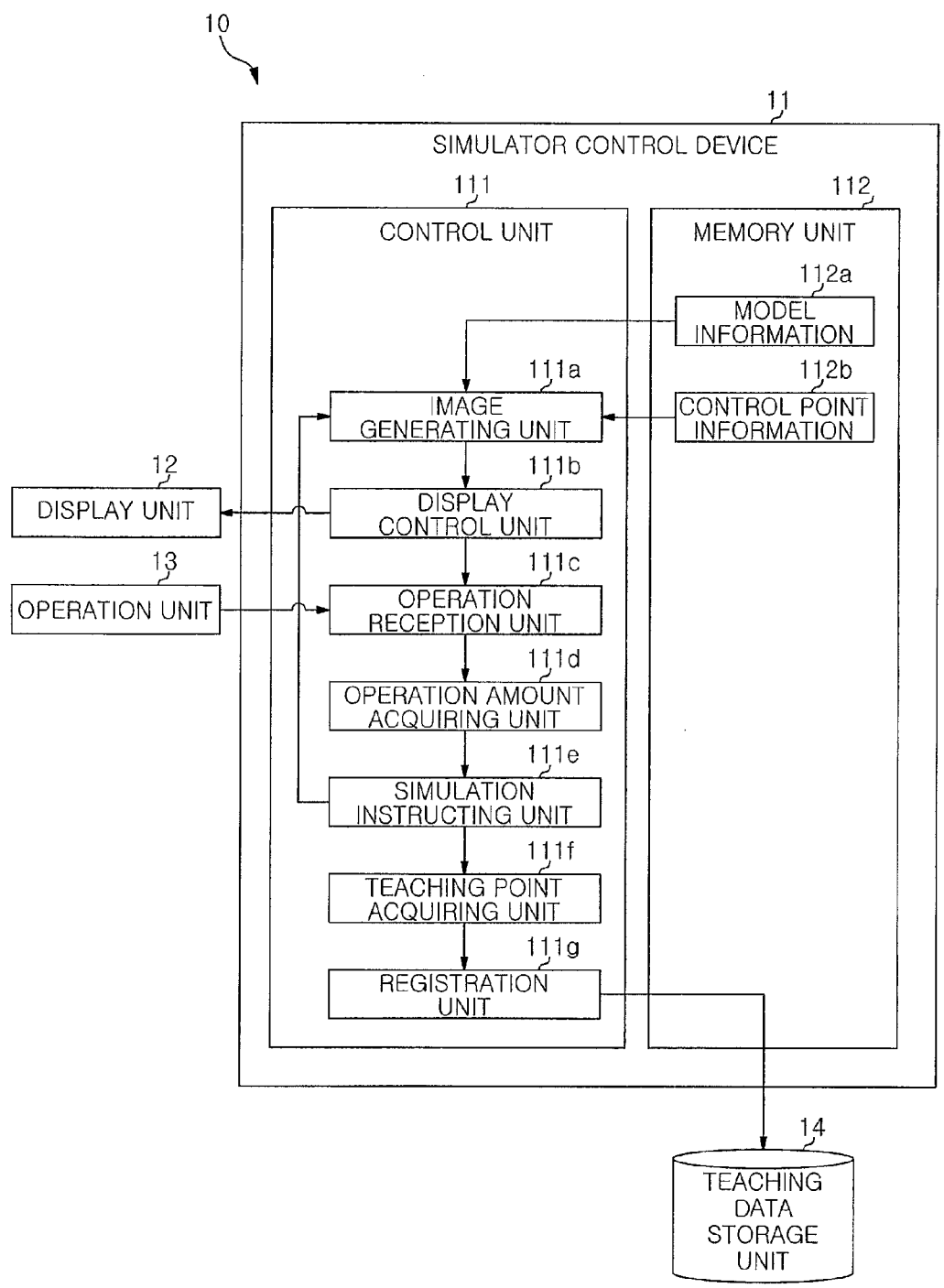

FIG.4

| TOOL PRESENCE/ABSENCE | TOOL KIND | CONTROL POINT | ... |
|---|---|---|---|
| TOOL PRESENCE | FIRST TOOL | TIP END PORTION | ... |
| | SECOND TOOL | CENTRAL PORTION | ... |
| | ⋮ | ⋮ | ... |
| TOOL ABSENCE | — | HAND REFERENCE POINT | ... |

DRAG AMOUNT = ONE DISPLACEMENT AMOUNT

DRAG AMOUNT = 30° ROTATION AMOUNT

ROBOT SIMULATOR, ROBOT TEACHING APPARATUS AND ROBOT TEACHING METHOD

CROSS-REFERENCE TO RELATED APPLICATION

The present disclosure contains subject matter related to that disclosed in Japanese Priority Patent Application No. 2013-032170 filed with the Japan Patent Office on Feb. 21, 2013, the entire contents of which are incorporated herein by reference.

FIELD OF THE INVENTION

An embodiment disclosed herein relates to a robot simulator, a robot teaching apparatus and a robot teaching method.

BACKGROUND OF THE INVENTION

Conventionally, there have been proposed different kinds of robot simulators which, when having a robot to perform a specified processing work, simulate an operation of the robot in advance and graphically represent the simulation result on a display of a computer.

By using the robot simulator, an operator can verify, based on the graphic representation, whether the robot interferes with an obstacle and can prepare teaching data without actually operating the robot.

A certain level of proficiency is required in order for an operator to prepare teaching data.

For this reason, there has been recently proposed a method in which touch keys using operation-direction-indicating words such as "up", "down", "left" and "right" are indicated around a graphic image of a robot displayed on a touch panel so that an operator can press the touch keys, thereby making the operation easy (see, e.g., Japanese Patent No. 3901772).

However, the conventional robot simulator needs to be improved to make a robot operable by an operator in an intuitively understandable manner regardless of the operator's proficiency.

For example, in the case of indicating the touch keys using operation-direction-indicating words as mentioned above, if the robot is provided with multiple axes and can be moved in many different directions, it becomes necessary to indicate an increased number of touch keys. This may possibly make it difficult to understand the operation.

Further, the directions indicated by the words such as "left" and "right" as mentioned above are not absolute but relative. For that reason, it is difficult for an operator to intuitively grasp the operation directions of the robot.

SUMMARY OF THE INVENTION

A robot simulator in accordance with an embodiment includes a generating unit, a display unit, a display control unit and a simulation instructing unit. The generating unit is configured to generate a virtual image that includes a virtual robot obtained by imaging an actual robot having at least one axis and an operation handle capable of operating three-dimensional coordinate axes having a control point of the virtual robot as the origin. The display unit displays an image. The display control unit is configured to control the display unit to display the virtual image generated by the generating unit. The simulation instructing unit is configured to, when receiving an operator's operation for the operation handle, acquire at least one of a displacement amount of the control point and a rotation amount of the three-dimensional coordinate axes attributable to the operator's operation, and is configured to instruct the generating unit to regenerate the virtual image in which a posture of the virtual robot is changed in accordance with the displacement amount and/or the rotation amount thus acquired.

BRIEF DESCRIPTION OF THE DRAWINGS

FIG. 2 is a block diagram illustrating a configuration of a robot simulator in accordance with the embodiment.

FIG. 4 is a view showing a setting example of control point information.

DESCRIPTION OF THE EMBODIMENTS

Hereinafter, an embodiment of a robot simulator, a robot teaching apparatus and a robot teaching method will be described in detail with reference to the accompanying drawings. The present disclosure is not limited to the embodiment to be described below.

The following description will be made by taking, as an example, a robot simulator that displays a graphic image of a three-dimensional model of a robot and surrounding equipment on a display unit such as an LCD (liquid crystal display) or the like. Hereinafter, the graphic image of the three-dimensional model will be referred to as a "virtual image".

Figure 1:
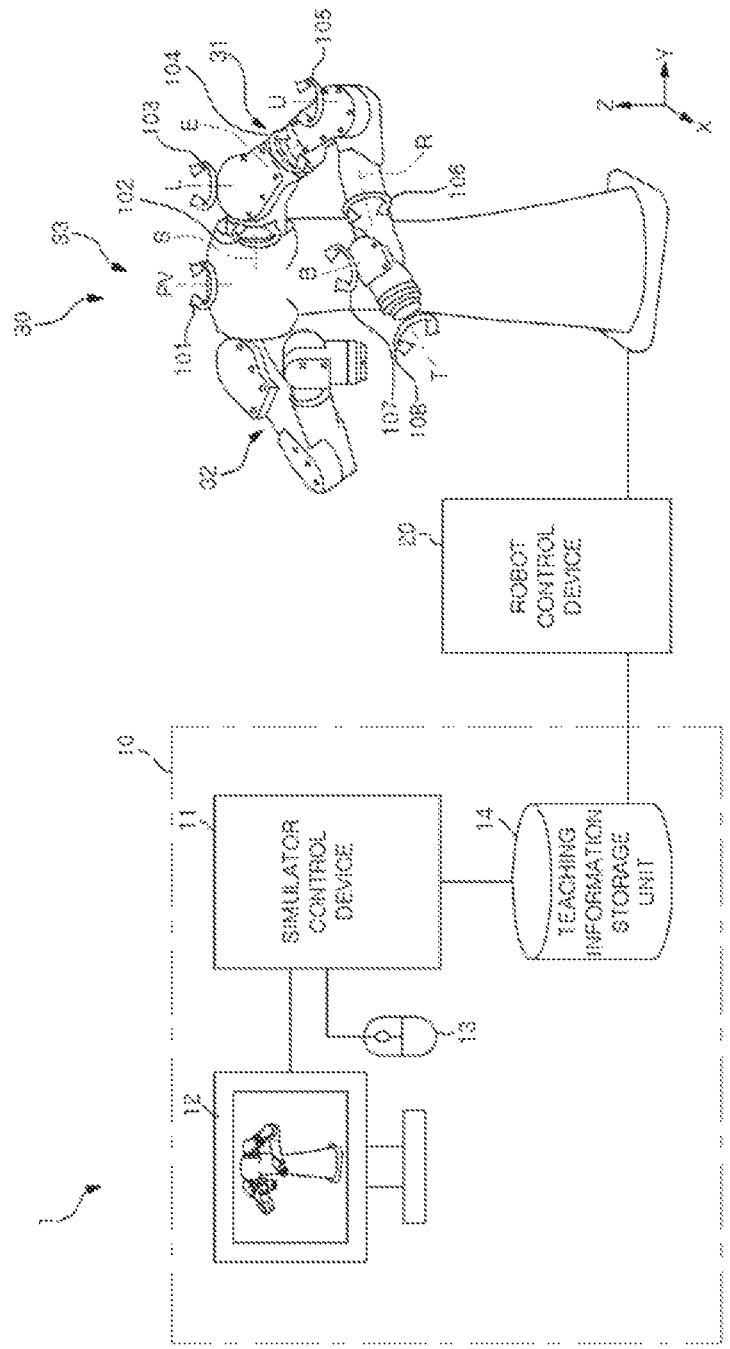
FIG. 1 is a schematic diagram showing an overall configuration of a robot system including a robot simulator in accordance with an embodiment.

FIG. 1 is a schematic diagram showing an overall configuration of a robot system 1 including a robot simulator 10 in accordance with an embodiment.

As shown in FIG. 1, the robot system 1 includes a robot simulator 10, a robot control device 20 and a robot 30. The robot simulator 10 includes a simulator control device 11, a display unit 12, an operation unit 13 and a teaching data storage unit 14.

The simulator control device 11 is a controller which controls the entire robot simulator 10. The simulator control device 11 includes an arithmetic processing unit, a memory unit, and so forth. The simulator control device 11 is connected to various parts of the robot simulator 10 such as the display unit 12, the operation unit 13 and the teaching data storage unit 14, so that data transmission can be performed therebetween.

The simulator control device 11 outputs to the display unit 12 a virtual image of the robot 30 obtained by simulating the motion of the robot 30 based on an operator's operation performed through the operation unit 13.

The simulator control device 11 can acquire teaching points of the robot 30 from the virtual image of the robot 30 based on the operator's operation performed through the operation unit 13 and can register the teaching points in the teaching data storage unit 14.

The display unit 12 is a display device such as a so-called LCD or the like. The operation unit 13 is a pointing device such as a mouse or the like. The operation unit 13 needs not be necessarily formed of a hardware component but may be formed of a software component, e.g., touch keys displayed on a touch panel display.

The teaching data storage unit 14 is a database which registers information on the "teaching points" for the robot 30.

The term "teaching points" used herein refers to the information that indicates target positions through which the respective joints of the robot 30 need to pass during an operation of the robot 30. The teaching points are stored as, e.g., pulse values of individual encoders arranged in servo motors for driving the respective shafts of the robot 30. The robot 30 is operated based on the information on a plurality of teaching points. Therefore, in the teaching data storage unit 14, the teaching points are stored in connection with the motions (teaching programs) of the robot 30.

In other words, the teaching programs of the robot 30 include combined information of the teaching points, operation commands for interpolation between the respective teaching points, and operation commands to end effectors. The teaching data storage unit 14 is configured to store, with respect to each of the teaching programs, information on the teaching points included in each of the teaching programs. When the robot 30 is operated, the robot 30 is moved pursuant to the teaching programs.

The teaching data storage unit 14 is connected to the robot control device 20 that is a controller for controlling the actual operation of the robot 30 so that data transmission can be performed therebetween. The robot control device 20 controls various operations of the robot 30 based on the teaching points registered in the teaching data storage unit 14.

In FIG. 1, the teaching data storage unit 14 (the robot simulator 10) and the robot control device 20 are connected to each other. However, if the information on the teaching points registered in the robot simulator 10 can be stored in a storage unit (not shown) in the robot control device 20, the teaching data storage unit 14 (the robot simulator 10) and the robot control device 20 need not be necessarily connected to each other.

For example, the information on the teaching points registered in the robot simulator 10 may be copied onto a storage medium such as a USB (Universal Serial Bus) or the like. Then, after connecting the storage medium to the robot control device 20, the information included in the storage medium may be stored in the storage unit in the robot control device 20 through a specified operation.

In FIG. 1, for the sake of making the description readily understandable, there is illustrated an example in which the teaching data storage unit 14 and the simulator control device 11 are provided separately. Alternatively, the teaching data storage unit 14 may be included in the simulator control device 11.

The robot 30 in accordance with the present embodiment is a dual arm robot that includes two arms, i.e., a first arm 31 and a second arm 32, and a body unit 33. The body unit 33 is provided rotatable about an axis PV with respect to a base unit (not designated by a reference symbol) fixed to a floor surface or the like (see an arrow 101 in FIG. 1).

The first arm 31 is a left arm and is installed on the body unit 33. More specifically, the first arm 31 is composed of a plurality of links and is provided with joints which are respectively rotatable about, e.g., an axis S, an axis L, an axis E and an axis U (see arrows 102 to 105 in FIG. 1).

The first arm 31 is further provided with joints which are respectively rotatable about, e.g., an axis R, an axis B and an axis T (see arrows 106 to 108 in FIG. 1). The first arm 31 is further provided with actuators for operating the respective joints. Servo motors may be appropriately used as the actuators. The servo motors drive the respective joints of the first arm 31 pursuant to the operation instructions from the robot control device 20.

A hand (not shown) as an end effector can be attached to a movable tip end portion that rotates about the axis T. Depending on the content of a task performed by the robot 30, the hand may hold a handling tool (hereinafter referred to as a "tool").

That is to say, the first arm 31 shown in FIG. 1 has seven axes S, L, E, U, R, B and T. The seven axes include the axis E serving as a redundant axis. The axis E makes it possible to perform an elbow angular motion by which only the angle of an elbow is changed without changing the position and posture of the tool. The first arm 31 is divided into, e.g., an upper arm and a lower arm, with reference to the elbow. Here, the axis E is a rotation axis extending in an extension direction of the upper arm. Simulation of the elbow angular motion will be described later with reference to FIGS. 8A to 8C.

The second arm 32 is a right arm and is installed on the body unit 33. The specific configuration of the second arm 32 is substantially identical with the configuration of the first arm 31. The second arm 32 differs from the first arm 31 only in terms of the left and right positions. Therefore, description on the second arm 32 will be omitted herein.

In the robot simulator 10, the first arm 31, the second arm 32 and the body unit 33 are regarded as individual units to be controlled. In the following description, a unit selected by an operator, among the units to be controlled which can be selected by a simulation instruction from the operator, is sometimes referred to as an "operation target".

In FIG. 1, there is shown a case where the robot 30 is a dual arm robot. However, the robot applied to the robot system 1 may be a single arm robot or a multi-arm robot provided with two or more arms. In addition, the robot 30 may be provided in a plural number.

Next, the block configuration of the robot simulator 10 in accordance with the embodiment will be described with reference to FIG. 2. FIG. 2 is a block diagram of the robot simulator 10 in accordance with the embodiment. In FIG. 2, there are shown only the components required for describing the robot simulator 10. Typical components are not shown in FIG. 2.

In the description with reference to FIG. 2, the internal configuration of the simulator control device 11 will be primarily described, and the display unit 12, the operation unit 13 and the teaching data storage unit 14 shown in FIG. 1 will be briefly described.

As shown in FIG. 2, the simulator control device 11 includes a control unit 111 and a memory unit 112. The control unit 111 includes an image generating unit 111a, a display control unit 111b, an operation reception unit 111c, an operation amount acquiring unit 111d, a simulation instructing unit 111e, a teaching point acquiring unit 111f and a registration unit 111g. The memory unit 112 stores model information 112a and control point information 112b.

The image generating unit 111a generates a virtual image of the robot 30 and surrounding equipment based on the model information 112a and the control point information 112b. The model information 112a includes graphic information defined in advance with respect to each of the kinds of the robot 30 and the surrounding equipment.

The control point information 112b is the information that defines a control point of the robot 30 in advance. The image generating unit 111a generates a virtual image which includes an operation handle (to be described later) capable of operating three-dimensional coordinate axes having the control point as the origin. The control point information 112b will be described later in detail with reference to FIG. 4.

The image generating unit 111a outputs the generated virtual image to the display control unit 111b. The display control unit 111b controls the display unit 12 to display the virtual image received from the image generating unit 111a.

Now, one example of the virtual image generated by the image generating unit 111a and displayed on the display unit 12 by the display control unit 111b will be described with reference to FIGS. 3A to 3D.

Figure 3A:
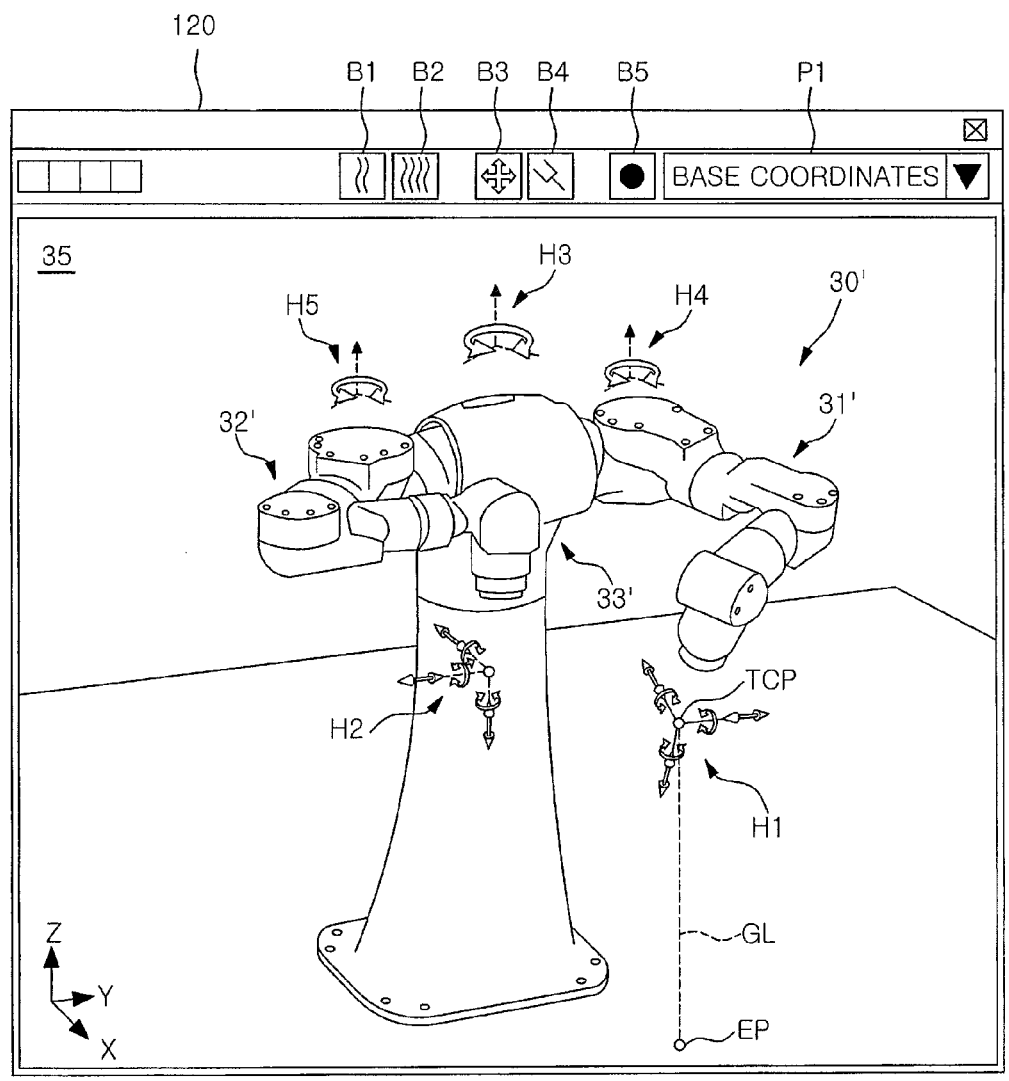
FIG. 3A is a first schematic diagram showing one example of a virtual image displayed on a display unit.
Figure 3B:
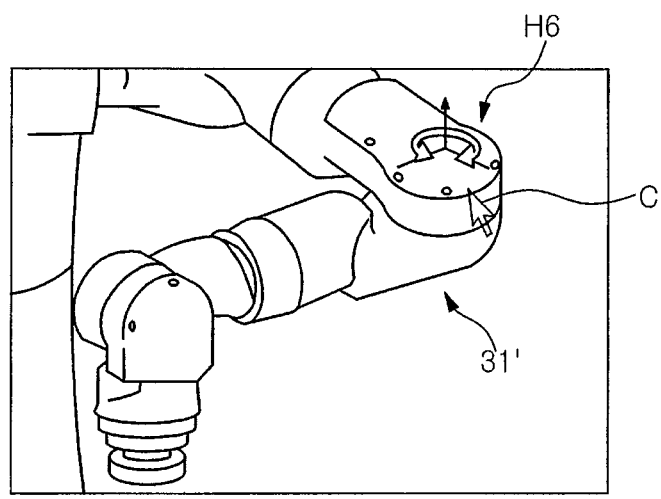
FIG. 3B is a schematic diagram illustrating one example of a case in which a mouse cursor is moved toward one axis.
Figure 3C:
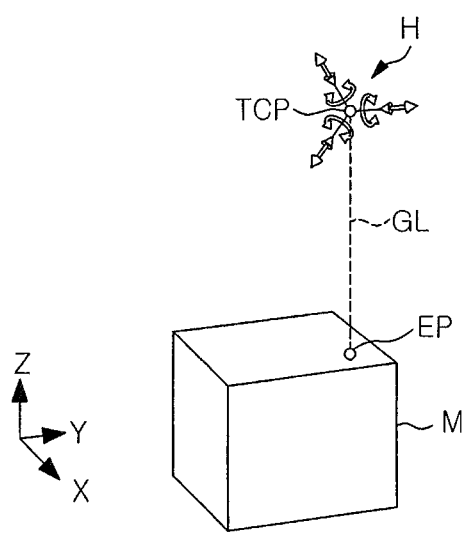
FIG. 3C is a view for explaining a guide line.
Figure 3D:
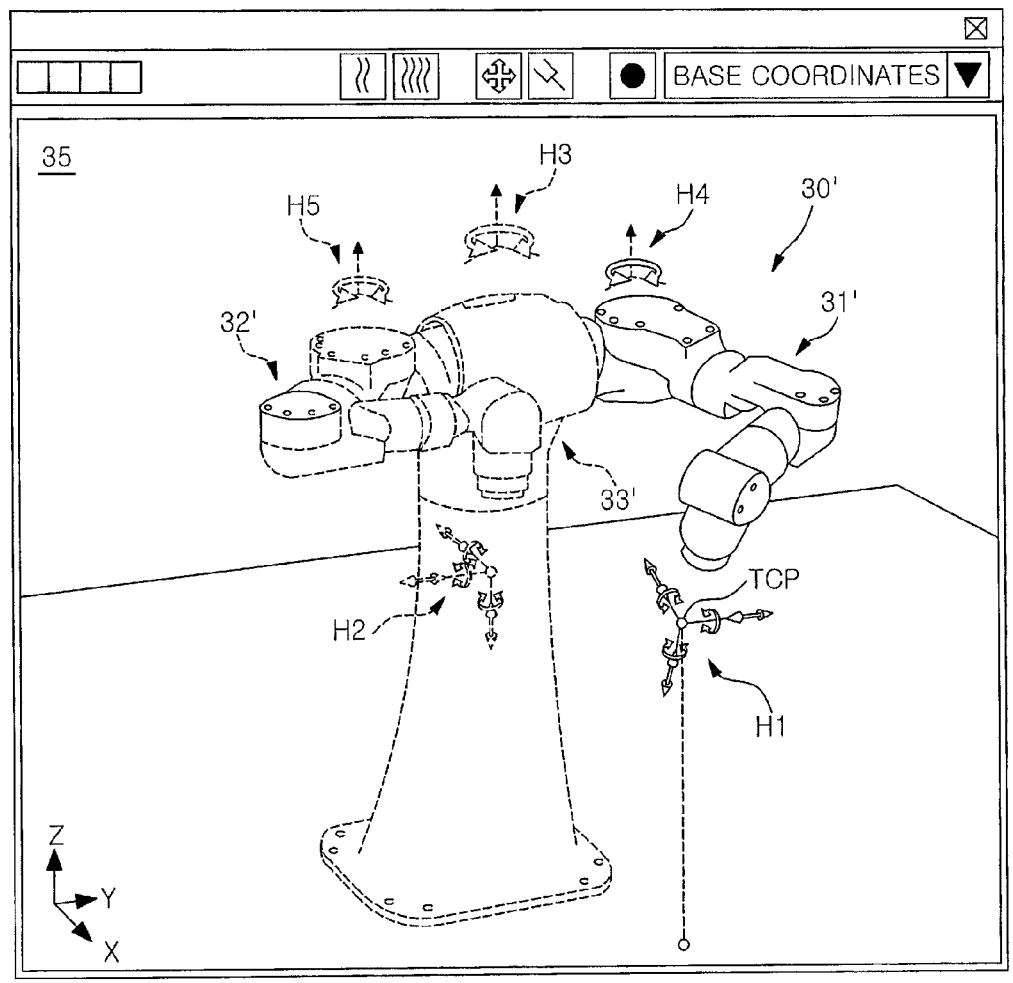
FIG. 3D is a second schematic diagram showing one example of a virtual image displayed on the display unit.

FIGS. 3A and 3D are first and second schematic diagram illustrating one example of the virtual image 35 displayed on the display unit 12. FIG. 3B is a schematic diagram illustrating one example of a case in which a mouse cursor C is moved toward one axis. FIG. 3C is a view for explaining a guide line. In FIGS. 3A and 3D, there is not shown the virtual image of the surrounding equipment other than the actual robot 30.

As shown in FIG. 3A, the virtual image 35 is displayed on a display window 120 which is one of display regions of the display unit 12. The virtual image 35 includes a virtual robot 30' obtained by imaging the actual robot 30 on the display window 120. The virtual image 35 further includes a specified control point and an operation handle capable of operating three-dimensional coordinate axes having the control point as the origin.

For example, the virtual image 35 shown in FIG. 3A includes a control point TCP and operation handles H1 to H5, wherein the operation handle H1 is for operating three-dimensional coordinate axes having the control point TCP as the origin. The operation handles H1 to H5 are operation parts that enable an operator to perform, e.g., a drag operation, through the operation unit 13.

More specifically, the operation handle H1 is an operation part that receives a teaching operation on a virtual first arm 31'. As shown in FIG. 3A, the control point TCP of the operation handle H1 is set as a representative point of the hand attached to the tip end of the first arm 31' or a representative point of the tool held by the hand.

The position of a specified control point such as the control point TCP is defined by the aforementioned control point information 112b. Now, a setting example of the control point information 112b will be described with reference to FIG. 4.

FIG. 4 is a view showing a setting example of the control point information 112b. As shown in FIG. 4, the control point information 112b includes, e.g., a "tool presence/absence" item, a "tool kind" item and a "control point" item. In FIG. 4, for the sake of making the description readily understandable, the data of the respective items are indicated in the form of texts. However, this is not intended to limit the type of data stored.

In the "tool presence/absence" item, there are stored data that define whether or not a tool is held by the hand (not shown) of the robot 30, i.e., "tool presence" or "tool absence".

In the "tool kind" item, there are stored data that indicate the kinds of tools. In the "control point" item, there are stored data that indicate the positions of control points corresponding to the kinds of tools (e.g., coordinate values indicating the positions relative to the hand). Depending on the shape of the tool held by the hand, an operator may easily operate the virtual robot 30' by appropriately setting the posture of the three-dimensional coordinate axes of the operation handle with respect to the hand. In preparation for this case, the data indicating the posture of the operation handle (e.g., the posture of the three-dimensional coordinate axes with respect to the hand) may be stored in the "control point" item. The coordinate system set in a corresponding relationship with the tool is sometimes referred to as a "tool coordinate system" for the sake of convenience.

For example, in the example shown in FIG. 3A, if it is assumed that a "first tool" is held by the hand, the "tip end portion" of the "first tool" is defined as a specified control point.

If it is assumed that a "second tool" is held by the hand, the "central portion" of the "second tool" is defined as a specified control point.

In a case of the "tool absence", a predetermined "hand reference point" is defined as a specified control point.

That is to say, it can be said that the control point information 112b is a database in which the kinds of tools used in the robot 30 are associated with the control points prepared in advance corresponding to the kinds of tools.

The image generating unit 111a acquires from the control point information 112b the specified control point corresponding to the kind of the tool which is assumed to be used by the robot 30 and generates a virtual image based on the specified control point thus acquired.

Details of the operation handle generated by using the specified control point as the origin will be described later with reference to FIGS. 5A to 5C. In the present embodiment, based on a setting example of the control point information 112b shown in FIG. 4, description will be made on a case where the specified control point (namely, the control point TCP) is the "tip end portion" of the "first tool", when the "first tool" is held by the robot 30.

Referring back to FIGS. 3A to 3D, as shown in FIG. 3A, the virtual image 35 includes the operation handle H2 for a virtual second arm 32', the operation handle H3 for the rotating movement of a virtual body unit 33', the operation handle H4 for the elbow angular motion of the virtual first arm 31' and the operation handle H5 for the elbow angular motion of the virtual second arm 32'.

For example, if an operation target is the first arm 31', the operation handle H1 is indicated by, e.g., a solid line as shown in FIG. 3A. At this time, the other operation handles H2 to H5 are indicated by, e.g., broken lines as shown in FIG. 3A. In this case, the indications may be distinguished by colors in such a way that the operation handle H1 is indicated in color and the other operation handles H2 to H5 are indicated in black and white. Moreover, the operation handle H1 may be indicated in a size larger than the size of the other operation handles H2 to H5 so that the indications can be distinguished from one another by size.

The first arm 31' including the operation handle H1 may be indicated in color and the second arm 32' or the operation handle H5 for the second arm 32' may be indicated in black and white. When the operation handles or arms other than the operation target are indicated in black and white in this manner, an operator can intuitively identify the operation handle or arm that is the operation target at the present time. A display image of the example mentioned above is shown in FIG. 3D. In FIG. 3D, the black/white indication portions are indicated by broken lines.

In accordance with the present embodiment, when performing a teaching operation with respect to a robot having a plurality of arms such as a dual arm robot or the like, a pre-designated arm as a teaching operation target is indicated to be intuitively identified as shown in FIG. 3D. This makes it possible to avoid performing teaching with respect to an unintended arm.

As shown in FIG. 3B, in a case where the first arm 31' is the operation target, when the mouse cursor C is moved toward one axis of the first arm 31', an operation handle H6 for the corresponding axis may be displayed.

As shown in FIG. 3A, for example, a guide line GL may be indicated to extend vertically downward from the control point TCP of the operation handle H1. In FIG. 3A, there is illustrated a case where the end point EP of the guide line GL reaches a floor surface. Alternatively, as shown in FIG. 3C, the guide line GL may be indicated to extend to a point where the end point EP thereof makes contact with an arbitrary model M. Moreover, the guide line GL may be indicated in a conspicuous color such as a red color or the like so that an operator can easily identify the guide line GL.

As described above, by indicating the guide line GL of a so-called laser pointer shape, even if the virtual robot 30' is obliquely seen in the virtual image 35 as shown in FIG. 3A, an operator can reliably grasp the positional relationship between the virtual robot 30' and the surrounding equipment or the obstacles.

That is to say, accurate teaching capable of reliably preventing interference of the actual robot 30 with the surrounding equipment or the obstacles can be performed in an intuitively understandable manner regardless of the operator's proficiency.

In FIGS. 3A and 3C, the guide line GL extends vertically downward. Alternatively, the extension direction of the guide line GL may be changed to an arbitrary direction depending on the shape of a work space or the position of the surrounding equipment or obstacles.

By operating, e.g., the operation handles H1 to H5 shown in FIG. 3A through the operation unit 13, an operator applies a simulation instruction for making the virtual robot 30' in the virtual image 35 perform a simulation operation. Specific examples thereof will be described later with reference to FIGS. 5A to 8C. In the present embodiment, the operation handles H1 to H5 are sometimes generally referred to as "operation handles H".

As shown in FIG. 3A, input buttons B1 to B5 are arranged on the display window 120. The input buttons B1 to B5 are operation parts which can be operated by an operator through the operation unit 13.

For example, an independent/synchronous motion switching function may be allotted to the input button B1 and the input button B2. When the input button B1 is pressed, the robot simulator 10 simulates only one unit that is the operation target (e.g., only the first arm 31').

When the input button B2 is pressed, the robot simulator 10 simulates one unit (e.g., the first arm 31') that is the operation target and the other unit (e.g., the second arm 32') synchronously. A specific example of the synchronous motion will be described later with reference to FIGS. 9A and 9B.

Further, for example, a switching function between display and non-display of the operation handles H1 to H5 may be allotted to the input button B3. Furthermore, for example, a function of displaying the name of the tool held by the hand may be allotted to the input button B4.

Furthermore, for example, a registration function may be allotted to the input button B5. When the input button B5 is pressed, the positions of the respective axes of the virtual robot 30' at that time are registered as teaching points in the teaching data storage unit 14.

As shown in FIG. 3A, a pull-down menu P1 as an operation part is further provided on the display window 120. A function of switching the coordinate systems of the operation handles H1 and H2 (e.g., robot coordinates, base coordinates, user coordinates, tool coordinates, and the like) can be allotted to the pull-down menu P1.

In this regard, the robot coordinates may be set as a coordinate system in which the installation portion of the first arm 31' or the second arm 32' on the body unit 33' is used as the origin. The base coordinates may be set as a coordinate system in which the installation portion of the body unit 33' on the base unit is used as the origin. The user coordinates may be set as a coordinate system in which an arbitrary point is defined as the origin by an operator.

In this way, by switching the coordinate systems with the pull-down menu P1, the operation handles can be changed in conformity with the selected coordinate system. For example, in FIG. 3A, the operation handle H1 is operated based on the tool coordinate system in which the control point TCP is used as the origin. Alternatively, the operation handle H1 may be operated based on a world coordinate system (to be described later).

When an operator selects a desired coordinate system through the pull-down menu P1, the image generating unit 111a generates a virtual image 35 that includes operation handles H having orthogonal coordinate axes corresponding to the selected coordinate system.

In addition, the robot simulator 10 can individually drive the respective joints of the virtual robot 30' in the virtual image 35 on the display unit 12 according to the operator's operation performed through the operation unit 13. Moreover, the robot simulator 10 can change the viewpoint that decides the viewing direction of the virtual image displayed and can enlarge or reduce the virtual image displayed.

Furthermore, the robot simulator 10 can find, by inverse kinematics computation, the positions of the respective joints of the virtual robot 30' in a state where the hand or tool of the virtual robot 30' has reached a particular point of the virtual image 35 designated by an operator, and can generate and display the virtual robot 30' in that state.

According to the operator's operation, the robot simulator 10 can read the teaching points registered in the teaching data storage unit 14 and can display the virtual robot 30' which has reached a particular teaching point. Since these functions of the robot simulator 10 are well-known in the art, detailed description of the functions not related to the present embodiment will be omitted herein.

Referring back to FIG. 2, description will be made on the operation reception unit 111c of the simulator control device 11. The operation reception unit 111c receives an operator's input operation inputted through the operation unit 13. If the input operation relates to a simulation instruction, the operation reception unit 111c notifies the operation amount acquiring unit 111d of the received input operation. The input operation related to the simulation instruction, which is referred to herein, corresponds to the operation of the operation handles H1 to H5 in the example shown in FIG. 3A.

If the input operation pertains to a teaching point registration instruction, the operation reception unit 111c notifies the teaching point acquiring unit 111f of the received input operation. The input operation pertaining to the teaching point registration instruction, which is referred to herein, corresponds to the operation of the input button B5 in the example shown in FIG. 3A.

The operation amount acquiring unit 111d analyzes the content of the input operation notified from the operation reception unit 111c. The operation amount acquiring unit 111d acquires the displacement amount of a control point and the rotation amount of three-dimensional coordinate axes having the control point as the origin, and notifies the simulation instructing unit 111e of the displacement amount and the rotation amount thus acquired.

The simulation instructing unit 111e notifies the image generating unit 111a of a simulation instruction that instructs the image generating unit 111a to generate a virtual image in which the posture of the virtual robot 30' is changed according to the displacement amount and the rotation amount notified from the operation amount acquiring unit 111d.

According to the simulation instruction received from the simulation instructing unit 111e, the image generating unit 111a regenerates a virtual image, which is displayed on the display unit 12 by the display control unit 111b. Thus, the virtual image performs a continuously-changing simulation operation.

Now, a specific operation of the operation handles H and a resultant simulation operation of the virtual image will be described with reference to FIGS. 5A to 8C. First, a specific example of the operation handles H will be described with reference to FIGS. 5A to 5C. In the following description, the specified control point will be consistently referred to as a "control point TCP".

Figure 5A:
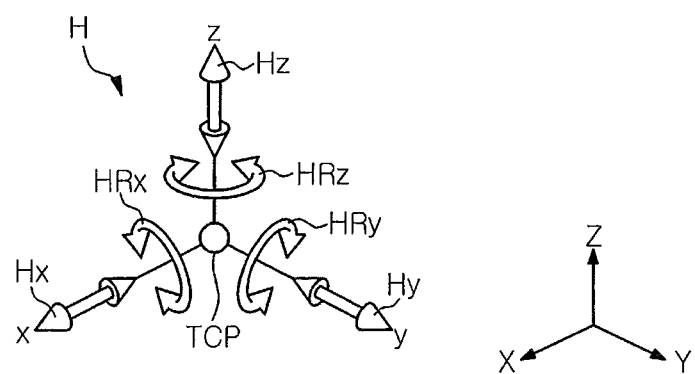
FIG. 5A is a view showing one example of an operation handle.

FIG. 5A is a view showing one example of an operation handle H. FIG. 5B is a view for explaining a displacement handle Hx. FIG. 5C is a view for explaining a rotation handle HRz.

In FIG. 5A, there are illustrated three-dimensional XYZ coordinate axes designated by capitals X, Y and Z. The XYZ coordinate axes constitute a coordinate system indicating a space as a whole, such as a so-called world coordinate system or the like, and correspond to the XYZ coordinate axes indicated at the left lower side on the display window 120 in FIG. 3A. The coordinate system of the operation handle H to be described below is indicated by the xyz coordinate axes of a local coordinate system (e.g., a tool coordinate system) differing from the XYZ coordinate system. For the sake of convenience in description, it is assumed that an x-axis is parallel to the X-axis, the y-axis to the Y-axis, and the z-axis to the Z-axis.

As shown in FIG. 5A, the operation handle H is an operation part for operating the xyz coordinate axes in which the control point TCP is used as the origin. The operation handle H includes displacement handles Hx, Hy and Hz for displacing the control point TCP along the axial direction of each of the xyz coordinate axes.

The displacement handles Hx, Hy and Hz each have a shape of a three-dimensional double-headed arrow extending along the corresponding axial direction of the xyz coordinate axes. Each of the displacement handles Hx, Hy and Hz is spaced apart from the control point TCP. The displacement handles Hx, Hy and Hz are included in each of the operation handles H1 and H2 in the example shown in FIG. 3A.

As shown in FIG. 5A, rotation handles HRx, HRy and HRz for rotating the xyz coordinate axes about their own axes are included in the operation handle H.

The rotation handles HRx, HRy and HRz have a shape of a three-dimensional double-headed arrow extending around the corresponding axis of the xyz coordinate axes. The rotation handles HRx, HRy and HRz are included in each of the operation handles H1 to H5 in the example shown in FIG. 3A.

Now, by taking the displacement handle Hx shown in FIG. 5B as an example, description will be made on a specific example of a case where the displacement handle Hx is operated. In FIG. 5B, the illustrations of the displacement handles Hy and Hz and the rotation handles HRx, HRy and HRz are omitted.

Figure 5B:
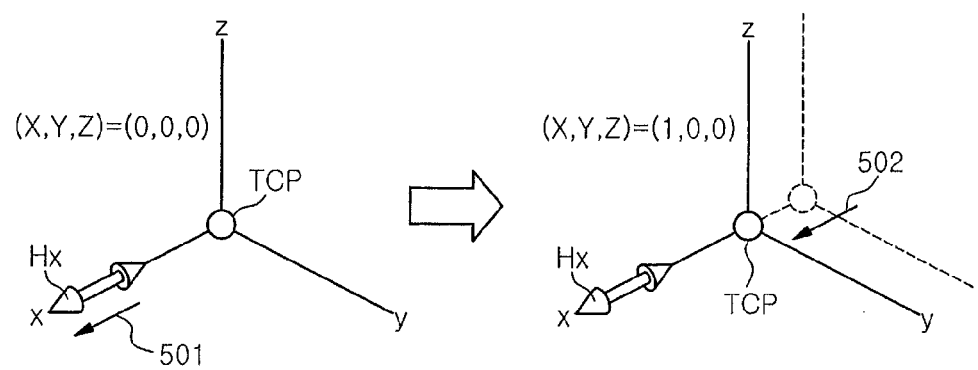
FIG. 5B is a view for explaining one example of a displacement handle.

As shown in FIG. 5B, the displacement handle Hx is operated by an operator's drag operation through the operation unit 13 (see an arrow 501 in FIG. 5B). At this time, the displacement handle Hx can be drag-operated along the corresponding x-axis direction.

As shown in FIG. 5B, for example, if the drag amount of the drag operation indicated by the arrow 501 is equivalent to one displacement amount, the image generating unit 111a displaces the control point TCP and the xyz coordinate axes having the control point TCP as the origin, by one displacement amount in the x-axis direction (see an arrow 502 in FIG. 5B).

In this case, in the XYZ coordinate axes (see FIG. 5A), if the coordinate values X, Y and Z of the control point TCP before the displacement are 0, 0 and 0, the coordinate values X, Y and Z of the control point TCP after the displacement become 1, 0 and 0. The xyz coordinate axes are formed by using the control point TCP after the displacement as the origin.

The image generating unit 111a regenerates a virtual image of the robot 30 based on the control point TCP and the xyz coordinate axes after the displacement, thereby allowing a simulation operation to be performed.

Needless to say, as implied by the shape of the three-dimensional double-headed arrow, the displacement handle Hx can be drag-operated in the opposite direction to the arrow 501 shown in FIG. 5B.

While not shown in FIG. 5B, if a drag operation is similarly performed with respect to the displacement handle Hy, the control point TCP and the xyz coordinate axes having the control point TCP as the origin are displaced along the y-axis direction. If a drag operation is similarly performed with respect to the displacement handle Hz, the control point TCP and the xyz coordinate axes having the control point TCP as the origin are displaced along the z-axis direction.

Next, by taking the rotation handle HRz shown in FIG. 5C as an example, description will be made on a specific example of a case where the rotation handle HRz is operated. In FIG. 5C, the illustrations of the displacement handles Hx, Hy and Hz and the rotation handles HRx and HRy are omitted.

Figure 5C:
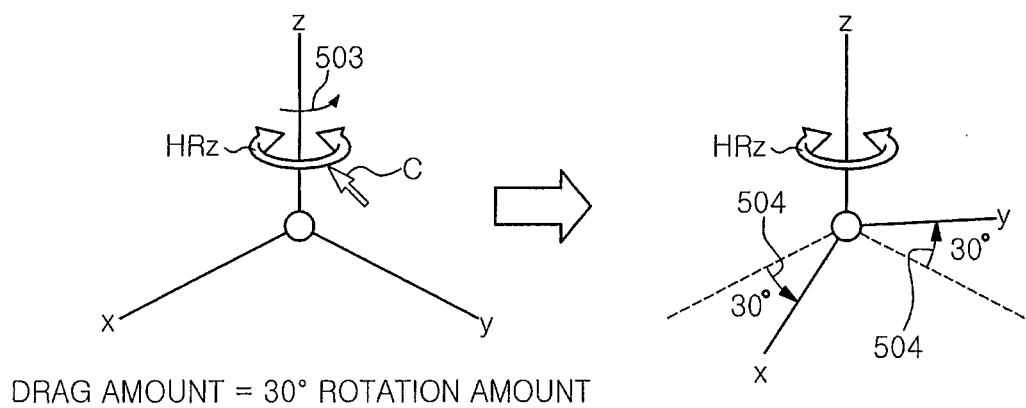
FIG. 5C is a view for explaining one example of a rotation handle.

As shown in FIG. 5C, the rotation handle HRz is operated by an operator's drag operation through the operation unit 13 (see an arrow 503 in FIG. 5C). At this time, the rotation handle HRz can be drag-operated around the corresponding z-axis by using the mouse cursor C.

Further, as illustrated in FIG. 5C, for example, if the drag amount of the drag operation indicated by the arrow 503 is equivalent to a rotation amount of 30 degrees, the image generating unit 111a rotates the xyz coordinate axes by 30 degrees about the z-axis (see an arrow 504 in FIG. 5C).

The image generating unit 111a regenerates a virtual image of the robot 30 based on the xyz coordinate axes after the rotation, thereby allowing a simulation operation to be performed.

Needless to say, as implied by the shape of the three-dimensional double-headed arrow, the rotation handle HRz can also be drag-operated in the opposite direction to the arrow 503 shown in FIG. 5C. In this case, the xyz coordinate axes are rotated in the opposite direction to the example shown in FIG. 5C.

While not shown in FIG. 5C, if a drag operation is similarly performed with respect to the rotation handle HRx, the xyz coordinate axes are rotated about the x-axis. If a drag operation is similarly performed with respect to the rotation handle HRy, the xyz coordinate axes are rotated about the y-axis.

As described above, the operation handle H includes the displacement handles Hx, Hy and Hz and the rotation handles HRx, HRy and HRz which respectively correspond to the xyz coordinate axes having the control point TCP as the origin and each of which has a shape of a double-headed arrow. Accordingly, an operator can operate the robot simulator in an intuitively understandable manner regardless of the operator's proficiency.

The shape of the operation handle H is not limited to one example shown in FIG. 5A. For example, the displacement handles Hx, Hy and Hz and the rotation handles HRx, HRy and HRz may be single-headed arrows.

Figure 6A:
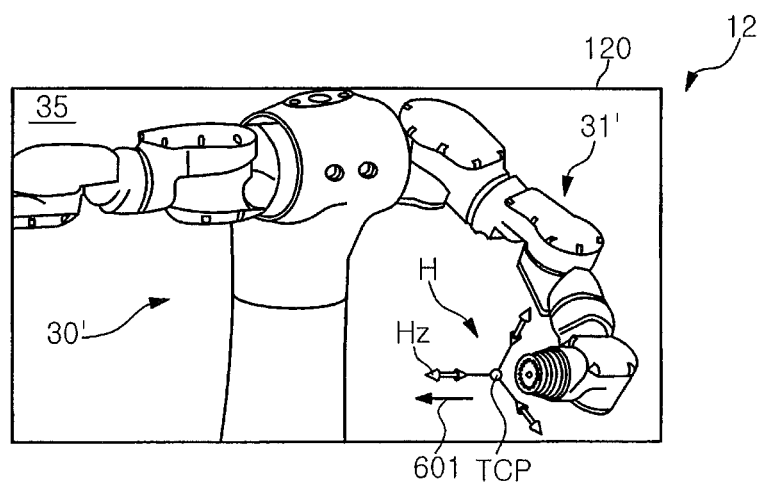
FIGS. 6A to 6C are first to third views showing a specific example of a simulation operation when the displacement handle is operated.
Figure 6B:
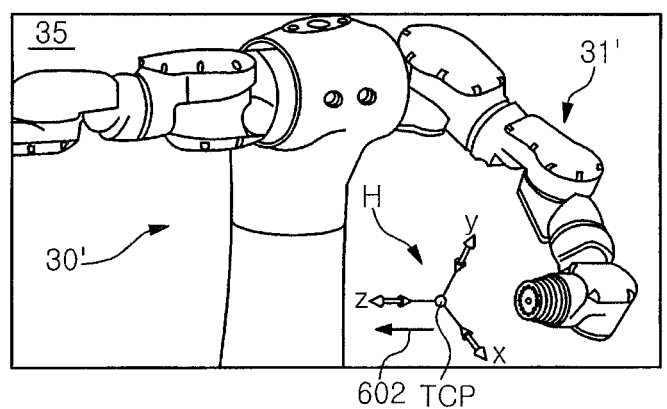
Figure 6C:
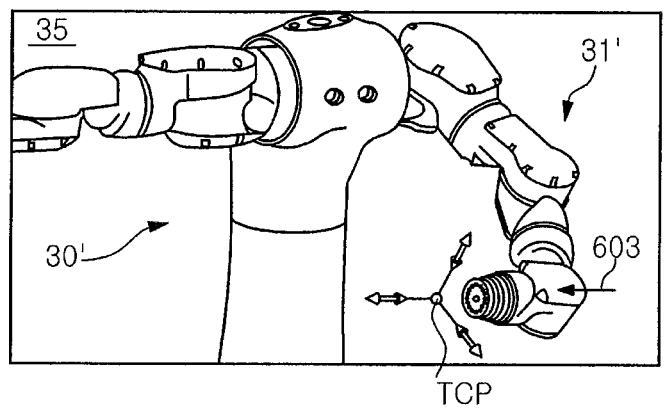

Next, a specific example of the simulation operation of the virtual robot 30' in the virtual image 35 in the case where the displacement handle Hz of the operation handle H (see FIG. 5A) is operated will be described with reference to FIGS. 6A to 6C. FIGS. 6A to 6C are first to third views illustrating a specific example of the simulation operation in the case where the displacement handle Hz is operated.

In FIGS. 6A to 6C, for the sake of convenience in description, the illustrations of the rotation handles HRx, HRy and HRz are omitted.

As shown in FIG. 6A, it is assumed that the virtual robot 30' is displayed on the display window 120 of the display unit 12. It is also assumed that the displacement handle Hz is drag-operated by an operator in the direction indicated by an arrow 601 in FIG. 6A.

In this case, as shown in FIG. 6B, the operation handle H is first displaced along the z-axis direction by a displacement amount corresponding to the drag amount of the operator's drag operation (see an arrow 602 in FIG. 6B). That is to say, the control point TCP and the xyz coordinate axes having the control point TCP as the origin are displaced together along the z-axis direction.

Subsequently, as shown in FIG. 6C, the movable tip end portion of the first arm 31' is displaced following the operation handle H. That is to say, in the virtual image 35, there is depicted a simulation operation of the virtual robot 30' in which the first arm 31' is moved in the direction of an arrow 603 in FIG. 6C.

Although the simulation operation in the case where the displacement handle Hz is operated has been described with reference to FIGS. 6A to 6C, it is needless to say that the displacement handles Hx and Hy make the same movement along the corresponding x-axis and y-axis, respectively.

Figure 7A:
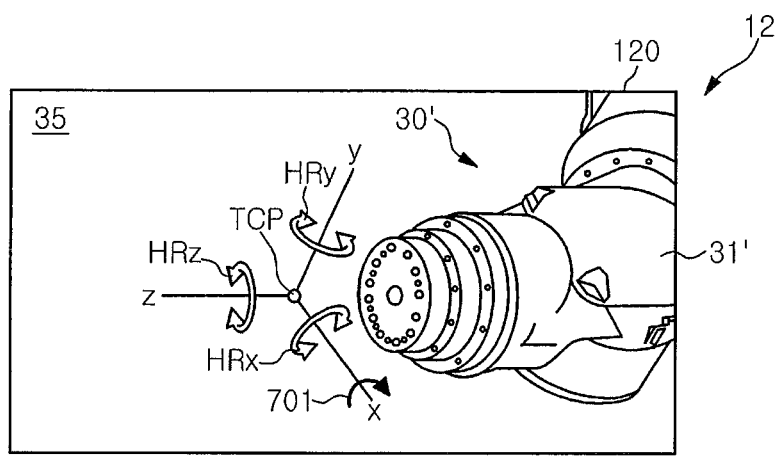
FIGS. 7A to 7C are first to third views showing a specific example of a simulation operation when the rotation handle is operated.
Figure 7B:
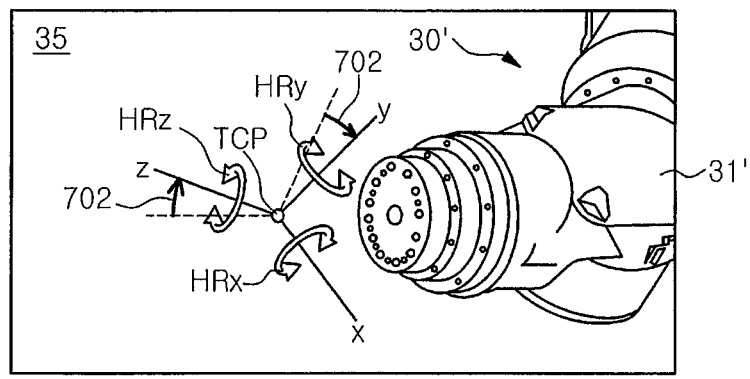
Figure 7C:
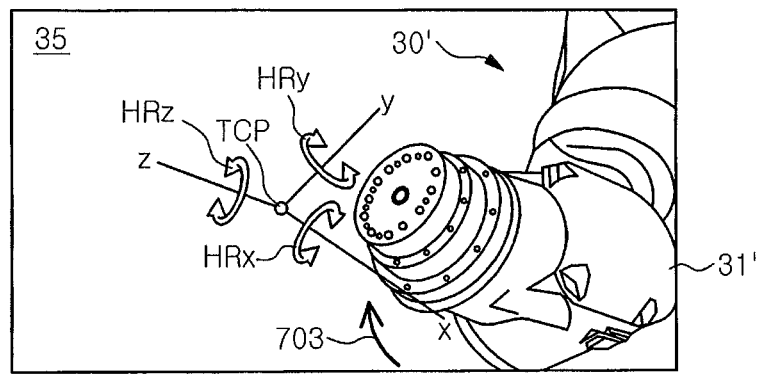

Next, a specific example of the simulation operation of the virtual robot 30' in the virtual image 35 in the case where the rotation handle HRz of the operation handles H is operated will be described with reference to FIGS. 7A to 7C. FIGS. 7A to 7C are first to third views illustrating a specific example of the simulation operation in the case where the rotation handle HRx is operated.

In FIGS. 7A to 7C, for the sake of convenience in description, the illustrations of the displacement handles Hx, Hy and Hz are omitted.

As shown in FIG. 7A, it is assumed that the first arm 31' of the virtual robot 30' is displayed on the display window 120 of the display unit 12. It is also assumed that the rotation handle HRx is drag-operated by an operator in the direction indicated by an arrow 701 in FIG. 7A.

In this case, as shown in FIG. 7B, the xyz coordinate axes are rotated about the x-axis by a rotation amount corresponding to the drag amount of the operator's drag operation (see an arrow 702 in FIG. 7B).

Subsequently, as shown in FIG. 7C, the movable tip end portion of the first arm 31' is depicted to follow the xyz coordinate axes after the rotation. That is to say, in FIG. 7C, there is illustrated a simulation operation of the first arm 31' in which the orientation of the movable tip end portion is changed according to the orientation of an arrow 703 indicated in FIG. 7C.

Although the simulation operation in the case where the rotation handle HRx is operated has been described with reference to FIGS. 7A to 7C, it is needless to say that the rotation handles HRy and HRz make the same movement about the corresponding y-axis and z-axis, respectively.

Figure 8A:
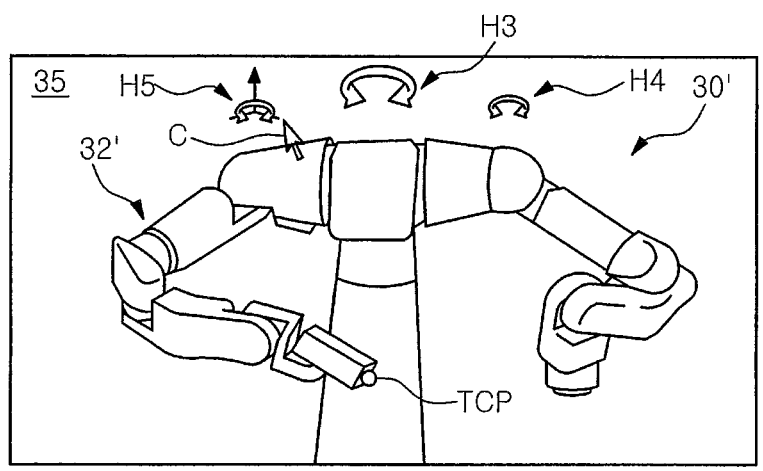
FIGS. 8A to 8C are first to third views showing a specific example of a simulation operation when an operation handle for elbow angular motion is operated.
Figure 8B:
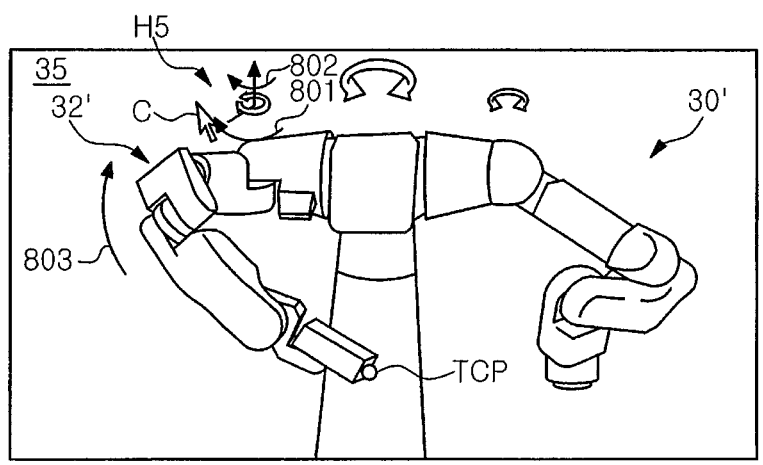
Figure 8C:
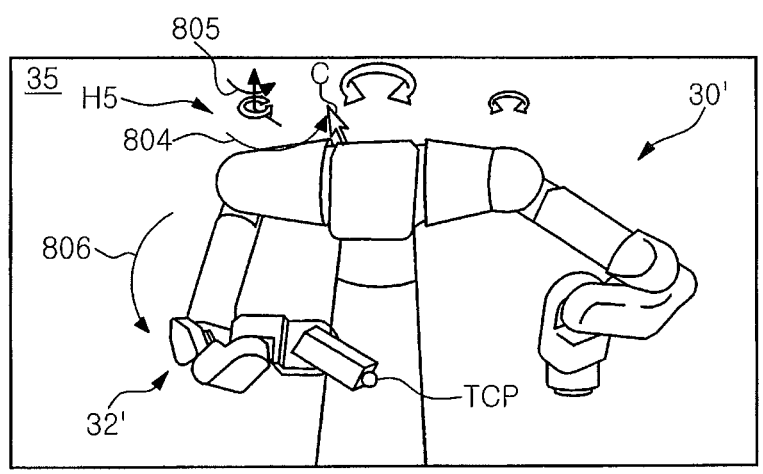

Next, a specific example of the simulation operation of the virtual robot 30' in the virtual image 35 in the case where the operation handle H5 for an elbow angular motion is operated will be described with reference to FIGS. 8A to 8C. FIGS. 8A to 8C are first to third views illustrating a specific example of the simulation operation in the case where the operation handle H5 for an elbow angular motion is operated.

In FIGS. 8A to 8C, the operation handle H5 corresponding to the second arm 32' is taken as an example. Since the same operation is performed with respect to the operation handle H4 corresponding to the first arm 31', the description thereof will be omitted.

As shown in FIG. 8A, the operation handle H5 for an elbow angular motion includes a rotation handle (see the rotation handle HRx in FIG. 5C) which can be rotated about a vertical axis by a drag operation using the mouse cursor C.

It is assumed herein that, as shown in FIG. 8B, a drag operation is performed by an operator in the direction indicated by an arrow 801 in FIG. 8B.

In this case, as shown in FIG. 8B, the rotation handle of the operation handle H5 is rotated about the vertical axis by a rotation amount corresponding to the drag amount of the operator's drag operation (see an arrow 802 in FIG. 8B).

Subsequently, as shown in FIG. 8B, in compliance with the rotation of the rotation handle, the angle of the elbow of the second arm 32' is changed with the control point TCP kept fixed. That is to say, in FIG. 8B, there is depicted a simulation operation of the elbow angular motion in which the second arm 32' is rotated along the direction of an arrow 803 in FIG. 8B while keeping the position and posture of the tip end portion of the second arm 32' unchanged.

As shown in FIG. 8C, if a drag operation is performed by an operator in the direction indicated by an arrow 804 in FIG. 8C, the rotation handle of the operation handle H5 is resultantly rotated in the direction of an arrow 805 in FIG. 8C.

In compliance with the rotation of the rotation handle, the second arm 32' performs an elbow angular motion along the direction of an arrow 806 in FIG. 8C.

By performing this operation, an operator can make the second arm 32' take a posture hardly interfering with the surrounding equipment or obstacles while keeping the position and posture of the tip end portion of the second arm 32' unchanged. Further, the operator can make the second arm 32' take a form in which the rotation amount of the joint of each axis of the second arm 32' does not reach a limit value thereof.

Figure 9A:
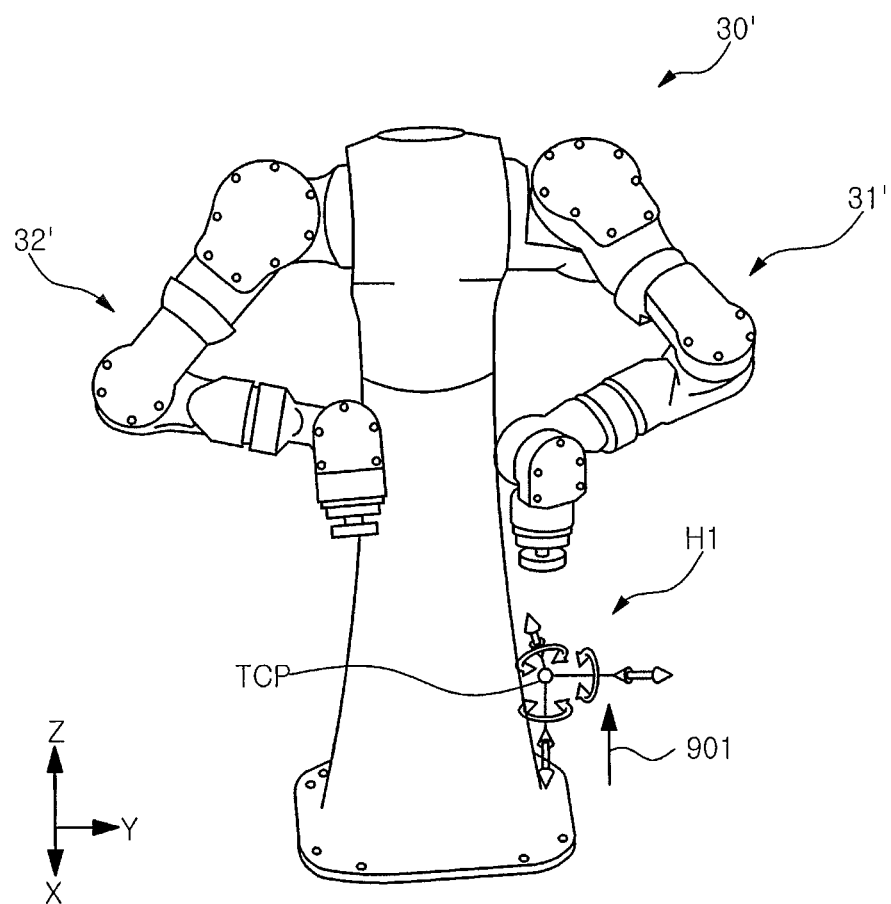
FIGS. 9A and 9B are first and second views showing a specific example of a simulation operation when a synchronous motion is selected.
Figure 9B:
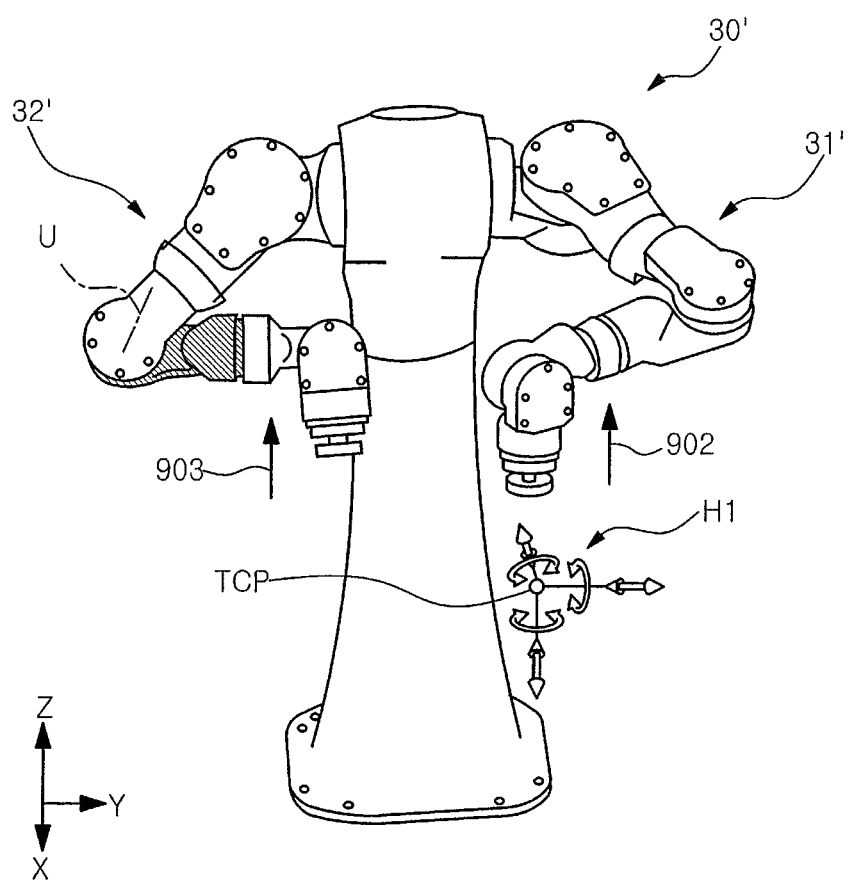

Next, a simulation operation when a synchronous motion is selected by pressing the input button B2 shown in FIG. 3A will be described with reference to FIGS. 9A and 9B. FIGS. 9A and 9B are first and second views showing a specific example of a simulation operation when a synchronous motion is selected.

At the time of selecting the synchronous motion, it is assumed that the first arm 31' is an operation target. It is also assumed that, as shown in FIG. 9A, the displacement handle of the operation handle H1 is drag-operated in the direction indicated by an arrow 901 in FIG. 9A.

In this case, as shown in FIG. 9B, the movable tip end portion of the first arm 31' is moved up in the direction indicated by an arrow 902 in FIG. 9B by a displacement amount corresponding to the operation amount of the drag operation. At this time, due to the selection of the synchronous motion, the movable tip end portion of the second arm 32' is also moved up together with the first arm 31' by the same displacement amount as the first arm 31' in the direction indicated by an arrow 903 in FIG. 9B.

That is to say, an operator does not need to simulate the respective arms separately. It is only necessary to drag-operate only the operation handle of one of the arms. This function is useful in the case, e.g., where an operator wishes to have a dual arm robot perform a simulation operation without changing the relative positional relationship or posture relationship between the hands or the tools of the tip end portions of the first arm 31' and the second arm 32'.

Further, as indicated by a hatched portion in FIG. 9B, it may be possible to clearly indicate how close the current rotation amount of the joint of each axis by the simulation operation is to a limit value thereof. For example, FIG. 9B illustrates an example clearly indicating that the rotation amount of the joint of the axis U of the second arm 32' is made close to or equal to the limit value thereof by the upward movement of the movable tip end portion of the second arm 32' caused by the drag operation.

While not shown in FIG. 9B, the indications of closeness to the limit value may be distinguished by color in such a way that a case where the closeness to the limit value has a margin of less than 10% is indicated in orange color and a case where the closeness of to the limit value has a margin of less than 3% is indicated in red color.

Taking a specific example of this case, when the rotatable range of the axis U is ±100° from a predetermined origin, an orange color is indicated if the absolute value of the rotation amount from a reference position of the axis U is larger than 90°, and a red color is indicated if the absolute value of the rotation amount is larger than 97°.

Use of these indications enables an operator to intuitively understand the closeness of a joint to the limit value. Accordingly, an operator may be offered to perform an operation in which the joint is moved away from the limit value.

Referring back to FIG. 2, description will be made on the teaching point acquiring unit 111*f* of the simulator control device 11. The teaching point acquiring unit 111*f* receives from the operation reception unit 111*c* a notice that the input button B5 (see FIG. 3A) is pressed. The teaching point acquiring unit 111*f* acquires, as teaching points, the positions of the respective axes of the virtual robot 30' in the virtual image 35 at the time when the input button B5 is pressed.

The teaching point acquiring unit 111*f* notifies the registration unit 111*g* of the teaching points thus acquired. The registering unit 111*g* registers, in the teaching data storage unit 14, the teaching point data in which the teaching points received from the teaching point acquiring unit 111*f* are associated with the postures of the robot.

The robot control device 20 controls various kinds of operations of the robot 30 based on the combination of the teaching points (the teaching point data) registered in the teaching data storage unit 14. Accordingly, the teaching point acquiring unit 111*f* and the registration unit 111*g* can be regarded as a "teaching unit" that teaches the robot 30 through the teaching data storage unit 14.

The memory unit 112 is a memory device such as a hard disk drive, a nonvolatile memory or the like. The memory unit 112 stores the model information 112*a* and the control point information 112*b*. The contents of the model information 112*a* and the control point information 112*b* have been described above and, therefore, will not be further described herein.

In the above description with reference to FIG. 2, there has been illustrated an example in which the simulator control device 11 generates the virtual image of the robot 30 based on the model information 112*a* and the control point information 112*b* registered in advance. Alternatively, it may be possible to sequentially acquire the information required for image generation from a host device connected to the simulator control device 11 for mutual communications.

As described above, the robot simulator in accordance with the embodiment includes the image generating unit (the generating unit), the display unit, the display control unit and the simulation instructing unit. The image generating unit generates a virtual image that includes a robot having at least a redundant axis and an operation handle capable of operating three-dimensional coordinate axes having a specified control point of the robot as the origin.

The display unit displays an image. The display control unit controls the display unit to display the virtual image generated by the image generating unit.

When receiving an operator's operation for the operation handle, the simulation instructing unit acquires at least one of the displacement amount of the control point and the rotation amount of the three-dimensional coordinate axes attributable to the operator's operation. The simulation instructing unit instructs the image generating unit to regenerate the virtual image in which the posture of the robot is changed according to the displacement amount and/or the rotation amount thus acquired.

Therefore, the robot simulator in accordance with the embodiment can be operated by an operator in an intuitively understandable manner regardless of the operator's proficiency.

In the aforementioned embodiment, description has been made by taking, as an example, the robot simulator capable of acquiring as teaching points the positions of the respective axes of the robot in the virtual image and capable of registering the teaching points as teaching point data. However, a robot simulator in the narrow sense may not include the teaching data storage unit 14 and the teaching unit including the teaching point acquiring unit 111*f* and the registration unit 111*g*. A robot simulator in the broad sense, which includes the robot simulator in the narrow sense, the teaching data storage unit 14 for storing the teaching point data in which the postures of the robot in the virtual image at arbitrary time points are related to the teaching points of the robot, and the teaching unit for teaching the robot based on the teaching point data stored in the teaching data storage unit 14, may be a robot teaching apparatus for teaching a robot.

In the aforementioned embodiment, there has been illustrated a case where the simulation operation is performed only on the virtual image. However, a practical robot may be actually operated in response to the operator's operation of an operation handle.

In the aforementioned embodiment, there has been illustrated a case where a mouse is primarily used as the operation unit and where a drag operation of an operation handle is performed by the mouse. However, the present disclosure is not limited thereto. For example, the display unit may be formed of a so-called multi-touch-type touch panel, and an operator may drag the operation handle by a multi-touch operation.

In the aforementioned embodiment, there has been described a case where the virtual image is a graphic image for a three-dimensional model. However, the number of dimensions is not limited thereto. The virtual image may be a graphic image for a two-dimensional model.

Other effects and other modified examples can be readily derived by those skilled in the art. For that reason, the broad aspect of the present disclosure is not limited to the specific disclosure and the representative embodiment shown and described above. Accordingly, the present disclosure can be modified in many different forms without departing from the spirit and scope defined by the appended claims and the equivalents thereof.

What is claimed is:

1. A robot simulator, comprising:
   a display unit; and
   a controller, when executing instructions, implementing:
   a generating unit configured to generate a virtual image including a virtual robot and an operation handle, wherein the virtual robot is obtained by imaging an actual robot having at least one axis and the operation handle is configured to operate three-dimensional coordinate axes having a control point of the virtual robot as an origin;
   a display control unit configured to control the display unit to display the virtual image generated by the generating unit; and
   a simulation instructing unit configured to, when receiving an operator's operation for the operation handle, acquire at least one of a displacement amount of the control point and a rotation amount of the three-dimensional coordinate axes attributable to the operator's operation, and configured to instruct the generating unit to regenerate the virtual image in which a posture of the virtual robot is changed in accordance with the displacement amount and/or the rotation amount thus acquired,
   wherein the operation handle comprises displacement handles to displace the control point and rotation handles to rotate the three-dimensional coordinate axes,
   wherein the displacement handles and the rotation handles are displayed on the display unit in a first virtual image when the display control unit controls the display unit to display the virtual image including the virtual robot, and
   wherein, when one of the displacement handles and the rotation handles is dragged, the display control unit controls the display unit to display a regenerated second virtual image in which the posture of the virtual robot is changed, the regenerated second virtual image including the one of the displacement handles and the rotation handles,
   wherein, when one of the displacement handles and the rotation handles is dragged, the display control unit controls the display unit to display a third virtual image in which an amount of the displacement or rotation is displayed, the third virtual image including the one of the displacement handles and the rotation handles.

2. The robot simulator of claim 1, wherein each of the displacement handles displaces the control point along a corresponding axial direction of the three-dimensional coordinate axes and each of the rotation handles rotates the three-dimensional coordinate axes about a corresponding one of the three-dimensional coordinate axes.

3. The robot simulator of claim 2, wherein each of the displacement handles has a shape of a double-headed arrow extending along the corresponding axial direction of the three-dimensional coordinate axes, the double-headed arrow spaced apart from the control point.

4. The robot simulator of claim 2, wherein said at least one axis is included in an arm unit of the virtual robot, one of the rotation handles is configured to perform an elbow angular motion by which an angle of an elbow of the arm unit is changed with the control point kept fixed, and the simulation instructing unit is configured to, when receiving an operation for said one of the rotation handles, instructs the generating unit to regenerate the virtual image in which the virtual robot performs the elbow angular motion in response to rotation of said one of the rotation handles.

5. The robot simulator of claim 4, wherein the actual robot is a dual arm robot including two arm units, and the simulation instructing unit is configured to, when receiving an operation for the operation handle whose operation target is one of the arm units, instruct the generating unit to regenerate the virtual image in which the arm units are operated in a synchronous manner according to the displacement amount or the rotation amount attributable to the operation for the operation handle.

6. The robot simulator of claim 1, further comprising:
   an operation part capable of selecting at least a coordinate system of the three-dimensional coordinate axes,
   wherein the generating unit is configured to, when the operator selects a desired coordinate system by using the operation part, include in the virtual image the operation handle having the three-dimensional coordinate axes corresponding to the desired coordinate system.

7. The robot simulator of claim 1, wherein the operation handle is operated by a drag operation of the operator.

8. The robot simulator of claim 1, wherein the generating unit is configured to generate the virtual image that indicates the operation handle and a part of the virtual robot serving as an operation target of the operation handle to be distinguished from other operation handles and other parts of the virtual robot.

9. The robot simulator of claim 1, wherein the generating unit is configured to include in the virtual image a guide line extending in an arbitrary direction from the control point and having an end point which makes contact with an arbitrary model.

10. The robot simulator of claim 9, wherein the arbitrary direction is a vertical downward direction.

11. The robot simulator of claim 1, wherein the simulation instructing unit is configured to, in response to displacement of one of the displacement handles, instruct the generating unit to regenerate the virtual image in which the posture of the virtual robot is changed based on a distance the one of the displacement handles is displaced.

12. The robot simulator of claim 1, wherein the simulation instructing unit is configured to, in response to rotation of one of the rotation handles, instruct the generating unit to regenerate the virtual image in which the posture of the virtual robot is changed based on a distance the one of the rotation handles is rotated.

13. The robot simulator of claim 1, wherein the controller is configured to generate teaching data that controls the operation of an actual robot based on the dragging of the one of the displacement handles and the rotation handles.

14. The robot simulator of claim 1, wherein when one of the displacement handles and the rotation handles is dragged, an amount of change of the posture of the virtual robot in the second virtual image is based on an amount of the dragging of the one of the displacement handles and the rotation handles.

15. A robot teaching apparatus, comprising:
a display unit; and
a controller, when executing instructions, implementing:
  a generating unit configured to generate a virtual image including a virtual robot and an operation handle, wherein the virtual robot is obtained by imaging an actual robot having at least one axis and the operation handle is configured to operate three-dimensional coordinate axes having a control point of the virtual robot as an origin;
  a display control unit configured to control the display unit to display the virtual image generated by the generating unit;
  a simulation instructing unit configured to, when receiving an operator's operation for the operation handle, acquire at least one of a displacement amount of the control point and a rotation amount of the three-dimensional coordinate axes attributable to the operator's operation, and configured to instruct the generating unit to regenerate the virtual image in which a posture of the virtual robot is changed in accordance with the displacement amount and/or the rotation amount thus acquired;
  a teaching data storage unit configured to store teaching point data in which postures of the virtual robot in the virtual image at arbitrary time points are associated with teaching points of the virtual robot; and
  a teaching unit configured to teach the actual robot based on the teaching point data stored in the teaching data storage unit, the actual robot being controllable based on the teaching point data,
wherein the operation handle comprises displacement handles to displace the control point and rotation handles to rotate the three-dimensional coordinate axes,
wherein the displacement handles and the rotation handles are displayed on the display unit in a first virtual image when the display control unit controls the display unit to display the virtual image including the virtual robot,
wherein, when one of the displacement handles and the rotation handles is dragged, the display control unit controls the display unit to display a regenerated second virtual image in which the posture of the virtual robot is changed, the regenerated second virtual image including the one of the displacement handles and the rotation handles,
wherein, when one of the displacement handles and the rotation handles is dragged, the display control unit controls the display unit to display a third virtual image in which an amount of the displacement or rotation is displayed, the third virtual image including the one of the displacement handles and rotation handles, and
wherein the teaching unit is configured to generate the teaching point data based on the dragging of the one of the displacement handles and the rotation handles.

16. A robot system comprising the robot teaching apparatus of claim 15.

17. The robot system of claim 16, further comprising:
the actual robot; and
a robot control device configured to control an operation of the actual robot based on the teaching of the teaching unit.

18. The robot teaching apparatus of claim 15, wherein when one of the displacement handles and the rotation handles is dragged, an amount of change of the posture of the virtual robot in the second virtual image is based on an amount of the dragging of the one of the displacement handles and the rotation handles.

19. A robot teaching method, comprising:
generating a virtual image including a virtual robot and an operation handle, wherein the virtual robot is obtained by imaging an actual robot having at least one axis and the operation handle is configured to operate three-dimensional coordinate axes having a control point of the virtual robot as an origin;
displaying the generated virtual image;
acquiring at least one of a displacement amount of the control point and a rotation amount of the three-dimensional coordinate axes attributable to an operator's operation for the operation handle, and regenerating the virtual image in which a posture of the virtual robot is changed in accordance with the displacement amount or the rotation amount thus acquired;
storing teaching point data in which postures of the virtual robot in the virtual image at arbitrary time points are associated with teaching points of the virtual robot; and
teaching the robot based on the stored teaching point data, the robot being controllable based on the stored teaching point data,
wherein the operation handle comprises displacement handles to displace the control point and rotation handles to rotate the three-dimensional coordinate axes,
wherein the displacement handles and the rotation handles are displayed in a first virtual image when the virtual image is displayed including the virtual robot,
wherein, when one of the displacement handles and the rotation handles is dragged, a regenerated second virtual image is displayed in which the posture of the virtual robot is changed, the regenerated second virtual image including the one of the displacement handles and the rotation handles, wherein when one of the displacement handles and the rotation handles is dragged, a third virtual image is displayed in which an amount of the displacement or rotation is displayed the third virtual image including the one of the displacement handles and the rotation handles, and wherein the stored teaching point data is generated based on the dragging of the one of the displacement handles and the rotation handles.

20. The robot teaching method of claim 19, wherein when one of the displacement handles and the rotation handles is dragged, an amount of change of the posture of the virtual robot in the second virtual image is based on an amount of the dragging of the one of the displacement handles and the rotation handles.

* * * * *